United States Patent [19]
Meriwether et al.

[11] Patent Number: 5,357,546
[45] Date of Patent: Oct. 18, 1994

[54] MULTIMODE AND MULTIPLE CHARACTER STRING RUN LENGTH ENCODING METHOD AND APPARATUS

[75] Inventors: Teresa A. Meriwether, Cary, N.C.; Bhaskar Sinha, Wappingers Falls, N.Y.

[73] Assignee: International Business Machines Corporation, Armonk, N.Y.

[21] Appl. No.: 923,293

[22] Filed: Jul. 31, 1992

[51] Int. Cl.$^5$ .............................................. H04B 1/66
[52] U.S. Cl. ................ 375/122; 358/261.1; 341/59; 381/34
[58] Field of Search ............ 375/122, 25; 341/59, 341/60; 381/34, 35; 358/261.1, 426

[56] References Cited

U.S. PATENT DOCUMENTS

| | | | |
|---|---|---|---|
| 4,150,400 | 4/1979 | Wong | 358/261 X |
| 4,302,775 | 11/1981 | Widergren et al. | 358/136 |
| 4,626,829 | 12/1986 | Hauck | 340/347 |

Primary Examiner—Stephen Chin
Assistant Examiner—Bryan Webster
Attorney, Agent, or Firm—John J. Timar

[57] ABSTRACT

Improvements are made to standard run length encoding compression techniques to permit frequently occurring repeated bytes to be dynamically redefined or reset to a default value such as a blank character, repeated multiple byte units or strings to be more efficiently coded and run length encoded enhancements allow compression of data where characters are represented by multiple bytes. The Sequence Control Byte (SCB) is modified to communicate indications to a receiver that the compression mode of 1 to N bytes per character is being changed and to indicate what the change is or that a con, non master repeat character frequently encountered in data is being redefined to be another character or that characters are going to be encoded in multiple bytes. The SCB format which is well known in the prior art is modified to include specific bit patterns or codes in the first two bits of the SCB byte to indicate setting of the bytes per character encoding mode to a different value, resetting the encoding mode to a default value or redefining a commonly repeated character or defining a character to be multiple bytes or a string of characters which may be multiple byte characters. The other six bits of the SCB are assigned code values unused in the prior art to indicate the number of tines that a defined character is to be repeated, whether a master character that has been defined is to be repeated or whether a character string is to be repeated. Two fields of data are thus formatted in the SCB with new values to indicate to a receiver these new criteria.

10 Claims, 4 Drawing Sheets

OPC = 0-15
R1 = 24-27
R2 = 28--31

C = CONT. BIT 0
M = 1-2 BITS MODE
FC = 8-15
K = 16-19 ACCESS KEY

MASTER CHARACTER

MULTIMODE AND MULTIPLE CHARACTER STRING RUN LENGTH ENCODING METHOD AND APPARATUS

FIELD OF THE INVENTION

This invention relates to digital data communication techniques and systems in general and more specifically to data compression methods for sending data over a communication system and interpreting it at a receiver, particularly data compression of the Run Length Encoded type.

Prior Art

Run Length Encoding is an old and well known compression technique historically employed in many different systems. It relies on the notion that, particularly in digital data, sequences of similar characters often occur in unbroken strings. Compression is accomplished in the Run Length Encoding method by sending a control character indicating the identity of the repeated character and the number of times it is to be repeated. U.S. Pat. No. 4,626,829 and the plethora of prior art cited as references therein may be referred to for understanding the general Run Length Encoding schemes known to exist.

Run Length Encoding compression algorithms in general use detect the repeated character bytes in an input string of digital data and replace them with two bytes of information, the first byte indicating the number of repeats of the repeated character and the second byte representing the character or byte which is to be repeated. The first byte or control byte is commonly called the "Sequence (or String) Control Byte" (SCB) and consists of a code field and a count field. A blank character generally encoded as X'40' is a common repeated byte. Repeats of a blank character are often encoded with a special code in the SCB so that only the SCB itself is required. This further improves the compression ratio. The foregoing algorithm and variations of it is implemented in IBM VTAM products and in other subsystems provided not only by IBM but by other companies.

Difficulties with the known prior art are that the frequently occurring repeat byte is difficult to redefine dynamically or to reset to a default value, repeated multiple byte units are difficult to encode efficiently and Run Length Encoding is presently not used to compress data where individual characters are represented by multiple bytes, a situation commonly encountered with compression of video data or Japanese Kanji text.

Languages such as the Japanese Kanji require more than a single eight-bit byte to represent each character. Currently existing Run Length Encoded methods do not facilitate compression of Kanji text effectively because they encompass only the compression of single byte characters. Graphic character sets, such as those used in video input/output subsystems for personal computers and the like usually require more than one byte to represent each screen character because the character that appears on the screen is represented to a display adapter driver as a two-byte pair to represent the ASCII character and a one-byte display attribute code which shows color intensity, highlighting, etc.

For the foregoing types of data the Run Length Encoding methods employed fall short since they are unable to encode repeated characters where the characters themselves consist of multiple bytes.

A coding mechanism in which frequently occurring repeated characters or repeated bytes in the case of a one byte per character mode of operation exists in the prior art as the socalled "master" character and is indicated by the SCB alone utilizing a specific bit pattern within the SCB. However, this does not permit redefinition of the default or commonly known repeat character.

Finally, repeated multiple character strings or units often occur in digital data but the prior art Run Length Encoding mechanisms do not permit compression of a multicharacter unit or string where the characters are not the same character repeated.

OBJECTS OF THE INVENTION

In light of the foregoing known difficulties with existing prior art Run Length Encoding methods and apparatus, it is an object of the present invention to provide an improved RLE compression method and apparatus which permits changing the mode of interpretation from 1 to N bytes per character or switching to a default mode of just one byte per character.

It is a further object of this invention to provide an improved Run Length Encoding method and apparatus which permit redefining the frequently occurring repeat character at will.

Another object of the invention is to provide an improved Run Length Encoding method and apparatus in which multiple different character strings may be encoded as a single unit and repeated in a highly efficient compression code.

BRIEF SUMMARY OF THE INVENTION

The invention is embodied by assigning new SCB codes from among those currently unused or reserved and by modifying the meanings of those already assigned. The all zero value of the eight bit SCB which has been reserved in the past is defined to mean "reset mode to one byte per character" and to indicate that the master character to be repeated for a commonly occurring character is reset to a blank (X'40') character. The SCB code 01000000 is redefined to be interpreted as a command to set the mode of operation from 1 to N bytes per character and to reset the master character to an arbitrarily defined character. The length (in bytes) of the new master character follows the SCB, and the master character itself follows the length byte. The SCB of 01aaabbb, where a and b are arbitrary digital values, is redefined to mean repeating a number of characters defined by aaa a number of times defined by bbb, where aaa and bbb are digital values from 2 to 7.

The SCB code 10mmmmmm is redefined to mean the encoding of a repeat of the master character from 1 to 63 times as represented by the digital value of mmmmmm. Finally, the SCB code 11pppppp is modified to mean repeating of the character following the SCB for a count equal to the value of pppppp from 2 to 63.

BRIEF DESCRIPTION OF DRAWINGS

The foregoing and other objects of the invention not specifically enumerated are met in a preferred embodiment of the invention further described and illustrated with respect to the drawings in which.

DETAILED DESCRIPTION OF PREFERRED EMBODIMENT OF INVENTION

Figure 1:
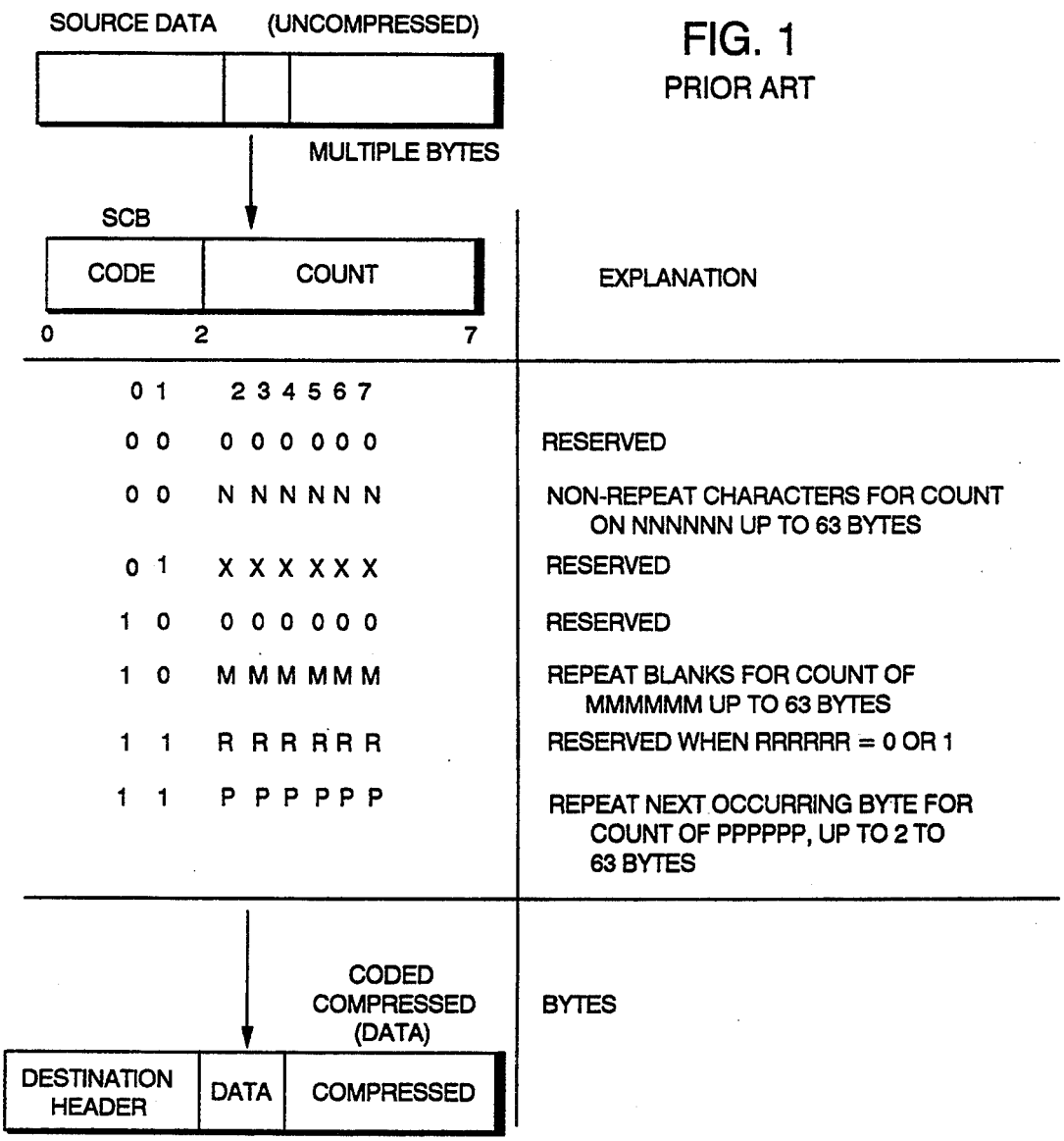
FIG. 1 illustrates the typical Run Length Encoding SCB assignments in the prior art and generally illustrates the process of Run Length Encoding.

FIG. 1 illustrates the well known Run Length Encoding (RLE) technique as employed in the prior art. In the top of FIG. 1, a schematic representation of source data in its raw or uncompressed form consisting of multiple 8-bit bytes as is conventional is represented. It is illustrated that the multiple bytes, which are examined by a computer process of comparing sequential bytes one against another to detect strings of repeated like bytes, may be encoded in the RLE compressed format as shown by the SCB code and count fields representing one sequence control byte of the Run Length Encoded compression technique known in the art.

In the known art, the SCB codes which comprise the first two bits of the SCB are assigned specific meanings or functions and the count field which represents the other six bits in the SCB are also defined meaning or significance as shown in the explanation portion of FIG. 1. The output of the compression process is also illustrated at the bottom of FIG. 1 where coded compressed data is assembled by the transmitter either in a CPU or in a modem as shown in FIG. 5 to incorporate a destination header or address followed by the SCB data, which may be one or two bytes and the compressed data itself which follows.

Figures 4, 5:
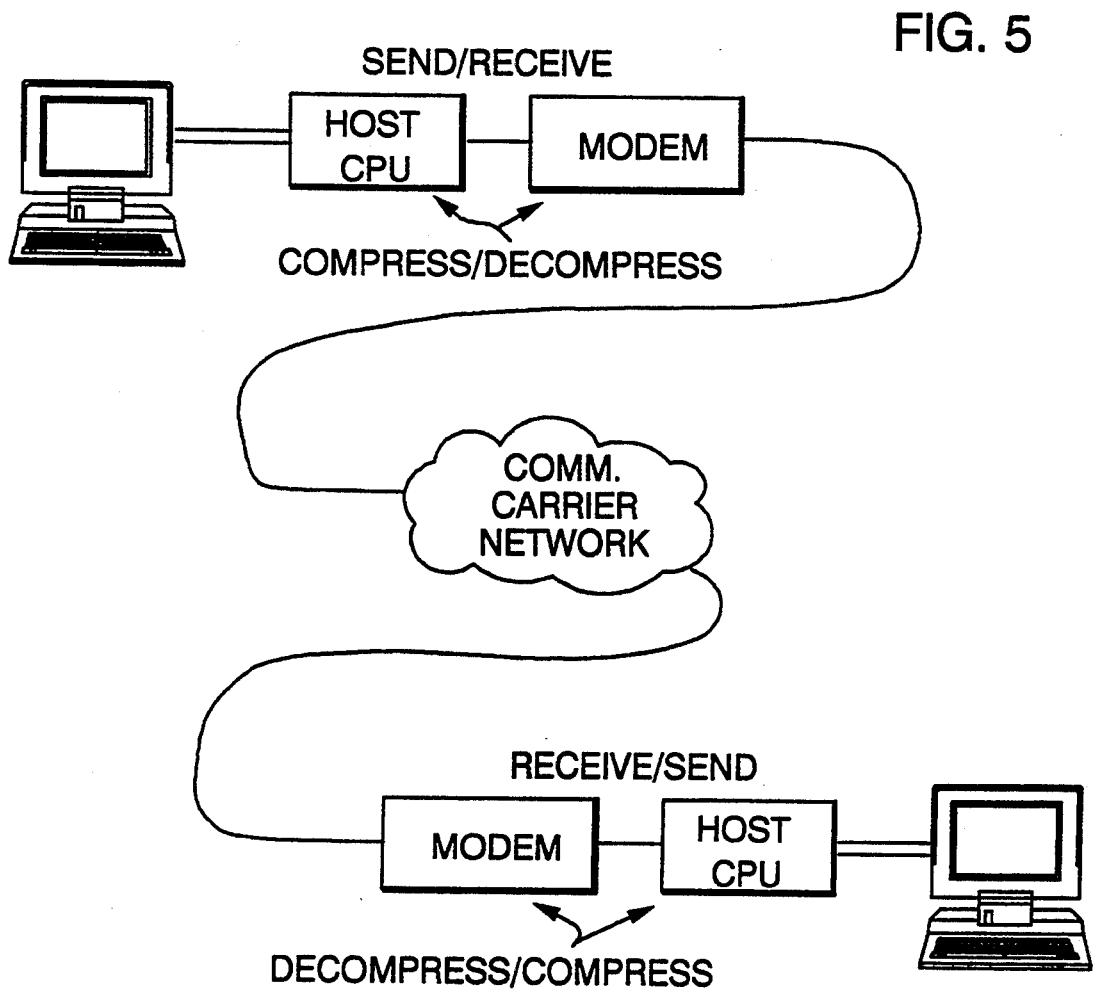
FIG. 4 illustrates computer functional code assignments for executing the compression or decompression process according to the preferred embodiment.
FIG. 5 illustrates an overall schematic of a data communication system which may include Run Length Encoding compression either in the host CPU or in a modem as is well understood.

At a receiver such as shown in FIG. 5, Run Length Encoded data is interpreted by examining the SCB and decoding its significance, SCB's having values all 0, 01 and any arbitrary count, 10 and all zero count or 11 and count of 0 or 1 are reserved and not used in the prior art. SCB value 00 followed by any arbitrary count is used in the prior art to indicate that characters are not repeated for a count equal to some number from 1 to 63 bytes as represented by nnnnnn, i.e. it is an indication that data from 1 to 63 bytes is not compressed and are not repeated characters. The code 10mmmmmm is interpreted to mean a repeating of blank characters for a count of mmmmmm up to 63 bytes and the code of 11pppppp is indicated or interpreted to mean the repeating of the next occurring byte following the SCB for a count equal to pppppp between 2 and 63 bytes.

Figure 2:
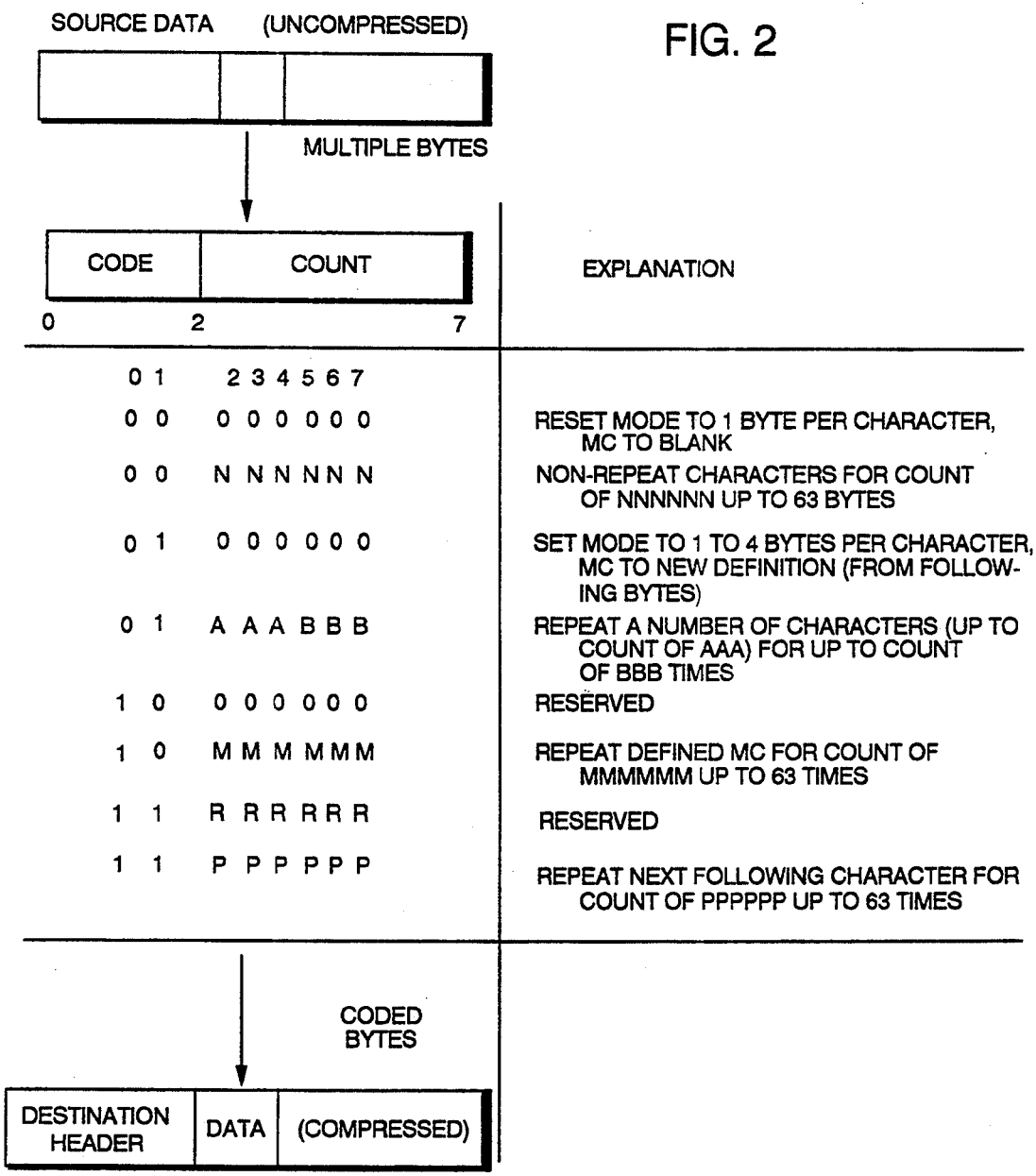
FIG. 2 illustrates the preferred embodiment of the invention in which new SCB values and their meanings are defined for use in the general compression process.

Turning to FIG. 2, the preferred embodiment of the invention contemplates reassigning reserved SCB values and/or redefining the meaning to encompass the capability for altering the master repeat character, changing the mode of interpretation from 1 to N bytes per character and allowing for the repeating of any arbitrarily defined character which may be composed of any arbitrary number of bytes for an arbitrary count or number of occurrences. The overall RLE encoding process and apparatus are the same as those indicated for FIGS. 1 and 5, but new functions and significance are attributed to the SCB values as will be described.

As referred to earlier, some languages and data communication environments require sending and receiving of characters represented by multiple bytes. Multiple byte characters are commonly encountered in Japanese Kanji language or in video input/output data with attribute bytes following the character representation. Currently, any number from 1 to 4 bytes may be required to represent a character in a given field of application or language, and while 4 is the currently known maximum, the general method of this invention is applicable to any arbitrary value n so that characters may be represented by any value from 1 to n bytes. The SCB value 01 000000 is utilized in the present invention to set the mode of operation from 1 to n bytes per character and to indicate the setting of a new definition of the master control or commonly repeated character to a new definition. The prior art reserved SCB code of all zeros is redefined to mean reset mode of operation to 1 byte per character and a reset of the master character to the commonly occurring blank character.

In other words, code 00 with a count of 0 in the SCB first and second code fields indicates a reset operation in which the mode of operation (or mode of character encoding) is reset to the default value of 1 byte per character and the master character which is to be repeated is reset to its default (hex) value of X'40' or blank. This particular SCB encoding may be used to make the implementation upwardly compatible with existing implementations in the industry where the mode of character encoding is always 1 byte per character and the master character or repeat character is always X'40' or blank and wherein a setting of the master character to some arbitrarily different character is not supported.

Code 00 in the first field of the SCB with a non-zero count from 1 to 63 specifies a sequence of non-replicated characters, i.e. bytes, in the case of a 1 byte per character mode of operation which follow the SCB.

A code of 01 in the first field of the SCB followed by a count of 0 in the second field indicates the contents of the byte following the SCB will be used to define the mode of character encoding operation from 1 to n depending upon the content of the byte following the SCB. It also is used to indicate to the receiver that the character next following the mode defining byte will be interpreted to be the new master character or repeat character.

Code 01 in the first field of the SCB followed by a count of aaabbb (in binary) indicates that the string of information following the SCB consists of a number of characters represented by the binary value of aaa which unit or string is to be repeated bbb times represented in binary by the bbb portion of the count field of the SCB. Other combinations of the count field for this SCB having a 01 first field are presently reserved. An alternative embodiment may use the byte following the SCB to contain the string repeat count from 2 to 255, in which case the string could be represented by the second field of the SCB to be anything from 2 to 63 characters in length.

The SCB code 10 in the first field with a count field (the "second field") of 0 is reserved as in the prior art. The first field coded 10 with a non-zero count field representing a count (in binary) from 1 to 63 specifies a sequence of master control characters to be repeated for the count equal to what is shown in the count field.

A code of 11 in the first field with a count of 0 or 1 is currently reserved. A code of 11 with a non-zero count from 2 to 63 is interpreted to specify a sequence of replicated characters where the byte following the SCB is the character which is to be repeated for the number of times indicated by the count field in the SCB.

It is customary to implement RLE encoding either in a host computer of a PC or mainframe type or in modems for compressing digital data for transmission over a communication line as is shown schematically in FIG. 5. Assuming that the compression occurs in the processor incorporated in most modern modems or in the host processor, compression routines are available in application software and may utilize the following internal formats and structures as shown in FIGS. 3 and 4.

Figure 3:
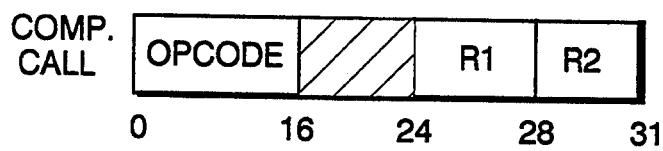
FIG. 3 illustrates the preferred form of the hardware embodiment of the implementation of the process in computer code calls and register contents.
Figure 3:
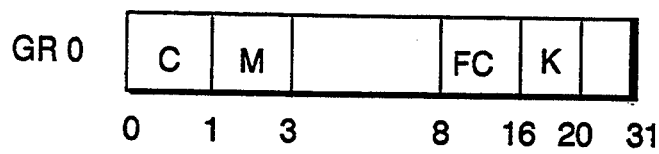
Figure 3:
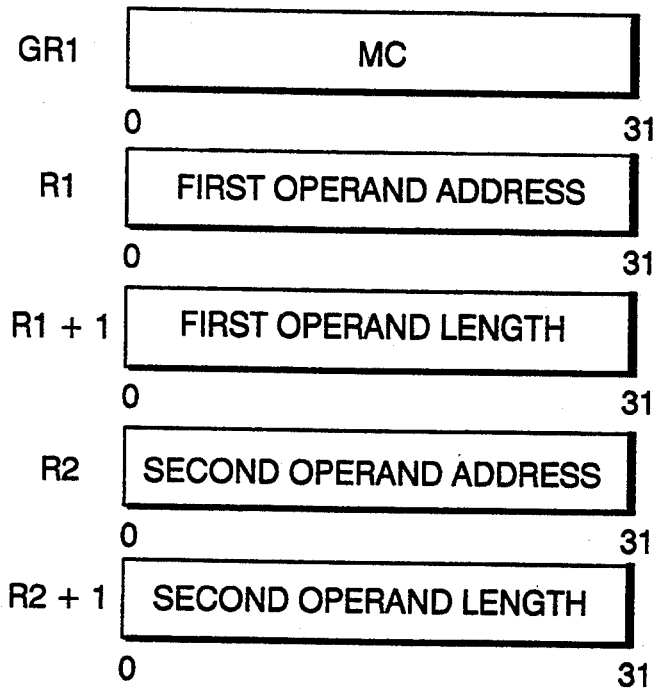

In FIG. 3, the compression operation call may be encoded as an operation code in bits 0-16 in a machine instruction with the general registers containing the operand addresses specified in bits 24-27 and 28-31 for general registers R1 and R2 which will contain the operand addresses of the first and second operands, the significance of which will be discussed later. A General Register GR0 is also indicated in FIG. 3 as containing several fields 6 including C which is a continuation status bit, M which is a mode indicating field of up to 2 bits and a function code field of up to 8 bits. A General Register GR1 contains the 32-bit representation of the master character and the General Registers R1 and R1+1, R2 and R2+2 contain, respectively, the first operand address and its length and the second operand address and its length as shown.

FIG. 4 illustrates the function code assignments that may be utilized in the processor where the functional code is represented in hexadecimal form and the designated process is as shown in the table of assignments. The compression or expansion operations are the only ones assigned in the table of assignments in FIG. 4, with all other function codes being reserved.

In operation, either a portion or all of the second operand is fetched and processed and the result placed in the first operand location. Whether a part or all of the second operand is processed is indicated by the condition code C. R1 and R2 registers are assumed to designate non-zero even numbered registers and bits 16-23 of the instruction compression call are ignored in this example. For uniformity, unused bits in all registers utilized in the instruction should be all zero. The locations in memory of the leftmost byte of the first operand and of the second operand are specified by the contents of the General Registers R1 and R2, respectively. The contents of R1+i and R2+2 contain the 32-bit signed number integers specifying the number of bytes in the respective operands. The handling of addresses in the General Registers R1 and R2 is dependent upon the addressing mode employed within the processor. Bit 0 (C) of General Register 0 is the continuation bit. A zero in this field indicates that the compression operation must be started from the beginning while a 1 indicates that the operation of compression is a continuation of a previously started compression operation so that the creation of a new SCB at the output to designate the mode or the master character is not required when continuation is shown.

Bits 1 and 2 of General Register 0 are the M field and specify the mode of operation. Since only two bits are employed in this embodiment, only four modes may be indicated. The modes of compression indicate that 1 to 4 bytes per character, dependent upon the language or type of characters being compressed, are indicated by this value. A mode of M=0 indicates 1 byte per character and M=3 would indicate 4 bytes per character mode. The M field may be expanded as desired to indicate any arbitrary number n of bytes per character. The data to be compressed in the raw data stream will dictate the mode of operation.

Bits 8-15 of the General Register 0 are the function code and specify the operation. The method supported in this embodiment of Run Length Encoding compression or decompression are the only functions assigned.

Access to the second operand, which is the source of data, is performed using the commonly employed program status word key which fetches the contents of the specified location and invokes the processing according to the specified method or algorithm within the processor. The results are stored in the first operand or destination performed using the access key K represented by bits 16-19 of General Register 0.

The contents of General Register 1 GR1 specify the Master Character MC to be used during a time period of data compression. Depending upon the mode of operation specified by the mode specifying field M, MC will be defined as being 1 to 4 bytes. If mode is 0, i.e. 1 byte per character, then bits 24-31 of General Register 1 will specify the Master Control Character MC. When M=3, i.e. 4 bytes per character, then bits 0-31 of General Register 1 will specify the Master Character MC. A particular Master Character is specified at the initiation of the compression operation and may be any arbitrary character known to be frequently encountered in the specific type of data being compressed.

When operation of the compression function is complete or when it is interrupted, the length fields in registers R1+1 and R2+2 are decremented by the number of bytes that have been fully processed in the two operands handled by the instructions. The addresses in R1 and R2 are incremented by the same amount. The field C in General Register 1 is set to a 1 to indicate that an interruption or completion of operation has occurred or not so that, when resumed, the hardware may take appropriate action. C is set to 0 when the operation ends because the source input has been completely processed. Condition code C=1 is set when the operation ends because the end of a string or compression run has been reached but more data remains to be compressed. If the end of the source input raw data is reached simultaneously, then condition code 0 would be set. Condition code 3 may be set when unusual conditions preclude normal completion of the compression operation, i.e. a hardware or software failure.

When the length of a given operand is 0, no access exceptions are recognized and no compression or movement of data will take place, the condition code C being set to 0 or 1 as appropriate.

For compression operations, the RLE method places special characters called SCB's as noted above into the first operand or output as the result of its operation and designates sequences of bytes in the second operand which is the input or raw data. For expansion using the RLE process, the algorithm will interpret the compressed data in the input or second operand field consisting of SCBs and characters following the SCBs and will regenerate the original data as output into the first operand.

As noted earlier, the single byte SCB is broken into two fields or parts with bits 0-1 being the code field and bits 2-7 being a count field. The significance of the codes and count fields and their method of interpretation has already been described. Given the general understanding of RLE compression and decompression and the assignments of the code and count fields and their meaning as shown with the discussion relative to FIG. 2, it will be apparent to those of skill in the art that the invention may be easily employed in existing RLE compression transmission or reception systems and that numerous departures, extension or modification by way of accounting for different types of character encoding modes of operation may be easily facilitated utilizing the general technique as described. Therefore, what is desired to be protected by letters patent is set forth in the following claims as illustrative and not by way of limitation wherefore what is claimed is:

What is claimed is:

1. A method of Run Length Encoding digital data for compressed transmission to a receiver for decompression comprising steps at a transmitter of:

generating a first sequence control byte (SCB) whenever a change in character byte encoding from 1 to n bytes per character is desired, said SCB having at least a first and a second control data field encoded so that said first field has the digital value 01 and said second field has the digital value 000000, said values indicating to a receiver that a change in character byte encoding mode is to be carried out on characters received following said SCB; and encoding a second control byte to follow said SCB, said second control byte indicating to said receiver the number of bytes per character to be used in decompressing received data at said receiver; and encoding a third control field to follow said second control byte, said third control field indicating to said receiver the identity of the master repeat character.

2. A method as claimed in claim 1, wherein:

said generating step of said first SCB is performed with its said second control data field encoded as a digital value aaabbb, indicating to said receiver that said compressed digital data is to be interpreted as repeated multicharacter strings where aaa is a binary number in the range of 2-7 and indicates the number of characters in a given string and bbb is a binary number in the range of 2-7 and indicates the number of times that the identified string is to be repeated.

3. A method as claimed in claim 1, wherein:

said generating step of said first SCB is performed with its said first control data field encoded as 00, indicating, in combination with said second control data field, that the mode of character byte encoding is to be reset to one byte per character and that the master character default value of blank is to be assumed.

4. A method as claimed in any one of claims 1-3, wherein:

said generating step of said first SCB is performed with its said first control data field encoded as the digital value 10 and with said second control data field encoded as a digital value mmmmmm being a binary value from 1 to 63 indicating the currently existing master character is to be repeated for a count equal to the value of mmmmmm in the decompressed form of the data.

5. A method as claimed in any one of claims 1-3, wherein:

said generating step of said first SCB is performed with its said first control data field encoded as a digital value 11 and said second field is encoded as a digital value pppppp being a binary value in the range of 2 to 63 indicating the character that next follows SCB is to be repeated in the decompressed data for a count equal to pppppp times.

6. Apparatus for Run Length Encoding digital data for compressed transmission to a receiver for decompression comprising:

means for generating a first sequence control byte (SCB) whenever a change in character byte encoding from 1 to n bytes per character is desired, said SCB having at least a first and a second control data field encoded so that said first field has the digital value 01 and said second field has the digital value 000000, said values indicating to a receiver that a change in character byte encoding mode is to be carried out on characters received following said SCB; and means for encoding a second control byte to follow said SCB, said second control byte indicating to said receiver the number of bytes per character to be used in decompressing received data at said receiver; and means for encoding a third control field to follow said second control byte, said third control field indicating to said receiver the identity of the master repeat character.

7. Apparatus as claimed in claim 6, wherein:

said means for generating said first SCB encodes said second control data field as a digital value aaabbb, indicating to said receiver that said compressed digital data is to be interpreted as repeated multicharacter strings where aaa is a binary number in the range of 2-7 and indicates the number of characters in a given string and bbb is a binary number in the range of 2-7 and indicates the number of times that the identified string is to be repeated.

8. Apparatus as claimed in claim 6, wherein:

said means for generating said first SCB encodes said first control data field as 00, indicating, in combination with said second control data field, that the mode of character byte encoding is to be reset to one byte per character and that the master character default value of blank is to be assumed.

9. Apparatus as claimed in any one of claims 6-8, wherein:

said means for generating said first SCB encodes said first control data field as the digital value 10 and said second control data field as a digital value mmmmmm being a binary value from 1 to 63 indicating the currently existing master character is to be repeated for a count equal to the value of mmmmmm in the decompressed form of the data.

10. Apparatus as claimed in any one of claims 6-8, wherein:

said means for generating said first SCB encodes said first control data field as a digital value 11 and said second field as a digital value pppppp being a binary value in the range of 2 to 63 indicating the character that next follows SCB is to be repeated in the decompressed data for a count equal to pppppp times.

* * * * *